(12) United States Patent
Stahl

(10) Patent No.: US 12,249,983 B2
(45) Date of Patent: Mar. 11, 2025

(54) SENSOR DEVICE

(71) Applicant: Huf Hülsbeck & Fürst GmbH & Co. KG, Velbert (DE)

(72) Inventor: Daniel Stahl, Wunstorf (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 148 days.

(21) Appl. No.: 17/638,450

(22) PCT Filed: Aug. 25, 2020

(86) PCT No.: PCT/EP2020/073706
§ 371 (c)(1),
(2) Date: Feb. 25, 2022

(87) PCT Pub. No.: WO2021/037828
PCT Pub. Date: Mar. 4, 2021

(65) Prior Publication Data
US 2022/0352890 A1 Nov. 3, 2022

(30) Foreign Application Priority Data

Aug. 29, 2019 (DE) ...................... 10 2019 123 194.9

(51) Int. Cl.
*H03K 17/96* (2006.01)
*E05B 81/76* (2014.01)

(52) U.S. Cl.
CPC .......... *H03K 17/962* (2013.01); *E05B 81/77* (2013.01); *H03K 2217/960705* (2013.01); *H03K 2217/960765* (2013.01); *H03K 2217/96078* (2013.01)

(58) Field of Classification Search
CPC ..... H03K 17/962; H03K 2217/960705; H03K 2217/960765; H03K 2217/96078; E05B 81/77
See application file for complete search history.

(56) References Cited

U.S. PATENT DOCUMENTS

2014/0133092 A1   7/2014   Leckelt et al.

FOREIGN PATENT DOCUMENTS

| DE | 202012007631 U1 * | 12/2012 | ......... G07C 9/00309 |
| DE | 102017100364 A1 * | 7/2018 | |
| DE | 102017112688 A1 | 12/2018 | |
| GB | 2409842 A | 7/2005 | |
| WO | WO2018177580 A1 | 10/2018 | |

OTHER PUBLICATIONS

Office Action for European Patent Application No. 20 761 570.9, mailed Apr. 16, 2024, and its English translation, 10 pages.

* cited by examiner

*Primary Examiner* — Daniel R Miller
(74) *Attorney, Agent, or Firm* — Christian S. Hans; Peter W. Schroen; Bozicevic, Field & Francis LLP

(57) ABSTRACT

The invention relates to a sensor device (100), in particular for a vehicle, comprising: a capacitive sensor unit (10) and a coil unit (20) which surrounds the capacitive sensor unit (10) at least partially, preferably geometrically. For this purpose, it is provided according to the invention that the capacitive sensor unit (10) has at least one first, in particular linear, sensor element (11), which is aligned essentially along a first geodesic (G1) of the coil unit (20).

16 Claims, 4 Drawing Sheets

SENSOR DEVICE

Figure 1:
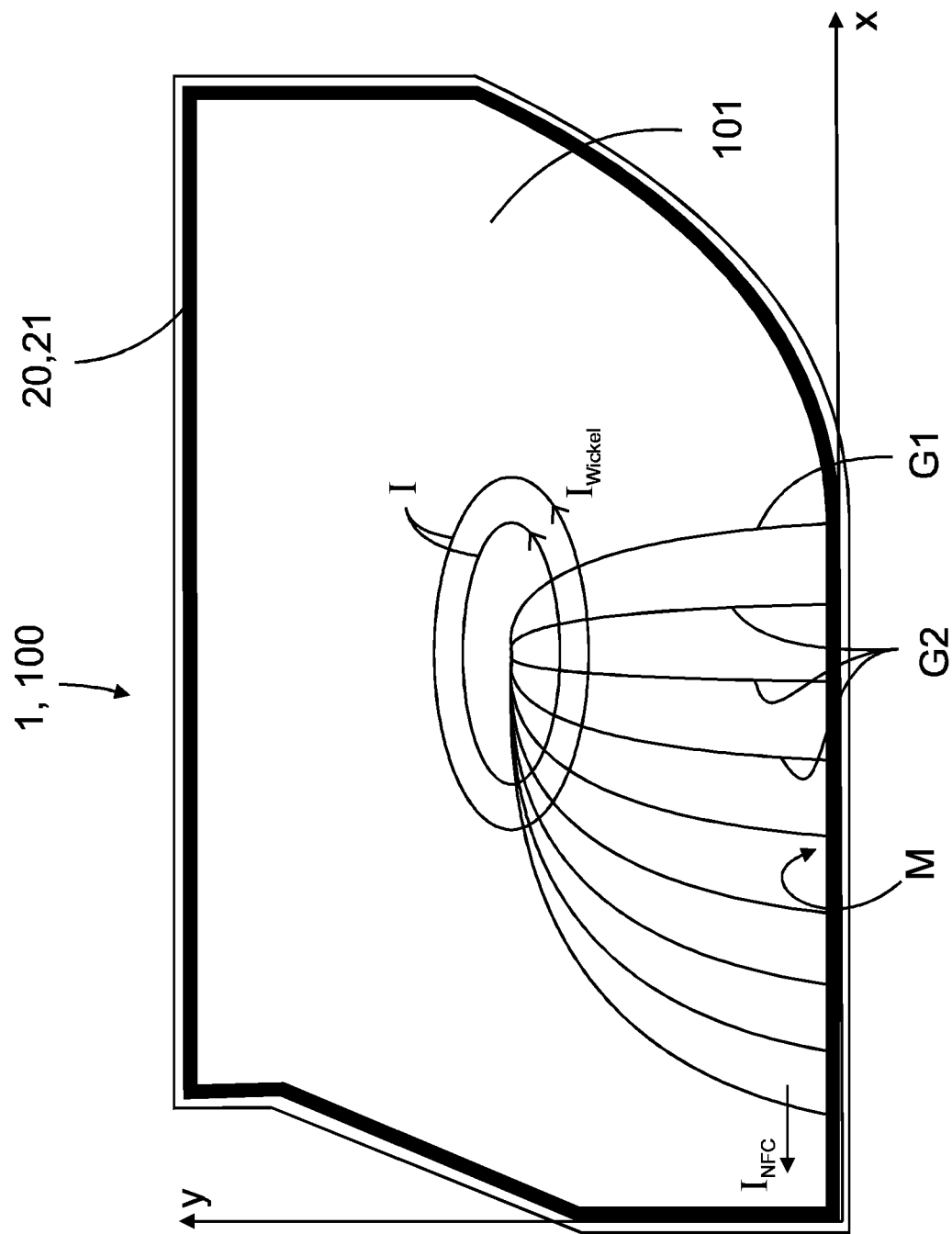

The invention relates to a sensor device, in particular for a vehicle, according to the generic term of the independent device claim. Furthermore, the invention relates to an electronic unit, in particular for actuating a movable part, such as for example a door, a flap or a lid, of a vehicle with a corresponding sensor device according to the generic term of the further independent device claim. Furthermore, the invention relates to a door handle for a vehicle with a corresponding electronic unit according to the generic term of the additional independent device claim. Furthermore, the invention relates to a method for manufacturing a corresponding sensor device, in particular for a vehicle, according to the generic term of the independent method claim.

It is known from the prior art that sensor devices are used to detect a presence of a user in the vicinity of a vehicle and to communicate with a vehicle-side security system and/or a user-side mobile handheld device. Such sensor devices may form a part of electronic units, for example, configured to operate a movable part, such as a door, a flap or a lid, of the vehicle. For detecting a presence of a user, the sensor devices have, for example, capacitive sensor units. Coil units, such as LDC coils or NFC coils, are often used to communicate with a vehicle-side security system and/or a user-side mobile handheld device. For this purpose, the coil units have, for example, a winding or a loop antenna (also called a loop).

In order to keep a sensor device of a vehicle as compact as possible, the capacitive sensor unit has so far been arranged as conductor tracks or a conductor track structure on a printed circuit board. The coil unit is also arranged on the same printed circuit board, which can also be configured as a flexible conductor foil. Due to the close arrangement of the coil unit next to the capacitive sensor unit, eddy currents can occur in the capacitive sensor unit, which generate disturbing effects. The eddy currents are generated by a magnetic field of the coil unit, which induces the eddy currents in the conductive paths or in the conductive path structure of the capacitive sensor unit.

The invention is based on the object of at least partially eliminate the disadvantages described above in a sensor device. In particular, it is the task of the invention to provide an improved sensor device in which the induction of eddy currents is reduced, even on a limited area of a printed circuit board. Furthermore, it is the object of the invention to provide an improved electronic unit for actuating a movable part, such as a door, a flap or a lid, of a vehicle with a corresponding sensor device. Furthermore, it is the object of the invention to provide a door handle for a vehicle with a corresponding electronic unit. Furthermore, it is the object of the invention to provide a method for manufacturing a corresponding sensor device.

The preceding object is solved by a sensor device, in particular for a vehicle, with the features of the independent device claim, in particular from the characterizing part. Furthermore, the task according to the invention is solved by an electronic unit for actuating a movable part, such as for example a door, a flap or a lid, of a vehicle with a corresponding sensor device with the features of the further independent device claim. Furthermore, the task according to the invention is solved by a door handle for a vehicle with a corresponding electronic unit with the features of the additional independent device claim. Furthermore, the object according to the invention is solved by a method for manufacturing a corresponding sensor device, in particular for a vehicle, with the features of the independent method claim, in particular from the characterizing part. Further features and details of the invention result from the respective dependent claims, the description and the drawings. In this context, features and details described in connection with individual aspects according to the invention naturally also apply in connection with the other aspects according to the invention and vice versa in each case, so that reference is or can always be made mutually with regard to the disclosure concerning the individual aspects of the invention.

The object is solved in particular by a sensor device, in particular for a vehicle, comprising a capacitive sensor unit and a coil unit which surrounds the capacitive sensor unit at least partially, preferably geometrically.

For this purpose, it is provided according to the invention that the capacitive sensor unit has at least one first, in particular linear, sensor element, which is aligned essentially along a first geodesic of the coil unit.

The capacitive sensor unit and the coil unit in the sense of the invention have line-shaped sensor elements, which are preferably photolithographically produced.

The capacitive sensor unit within the scope of the invention has one or more conductor tracks as sensor elements, which can form a line-shaped conductor track structure. The capacitive sensor unit may be configured, for example, to detect an approach of a user to the sensor device.

Instead of the capacitive sensor unit, other sensor units for detecting an approach of a user to the sensor device are also conceivable within the scope of the invention, such as pressure sensors, including inductive pressure sensors, ultrasonic sensor units or optical sensor units.

The coil unit according to the invention can be configured as a high-resolution, sensitive inductive sensor unit with at least one LDC coil, which can detect a movement of a metallic element of a few millimeters or even micrometers with respect to the at least one LDC coil.

In addition, the coil unit according to the invention can be configured as an electromagnetic sensor unit with at least one NFC coil, which can be used for contactless exchange of data by means of electromagnetic induction through loosely coupled coils, for example over short distances of a few centimeters. The coil unit can be configured, for example, for communicating with a vehicle-side security system and/or a user-side mobile handheld device, in particular for verifying authentication of the user detected by the capacitive sensor unit.

The coil unit surrounds the capacitive sensor unit, preferably geometrically. Thereby, the coil unit and the capacitive sensor unit may be arranged on one surface. In the scope of the invention, the sensor elements of the capacitive sensor unit are located within a turn or within a loop antenna of the coil unit, i.e. encircled or enclosed by a turn or loop antenna of the coil unit.

The coil unit according to the invention generates a magnetic field when energized. The magnetic field lines thereby wind around the energized winding or loop antenna of the coil unit. These magnetic field lines can in turn induce eddy currents in adjacent conductive paths of the sensor unit.

Advantageously, within the scope of the invention, the configuration or geometry of the capacitive sensor unit (at least of the first sensor element) can be adapted on the basis of the magnetic field of the coil unit so that the induction of the eddy currents is at least reduced, preferably minimized. Specifically, the capacitive sensor unit (at least the first sensor element) is formed based on an analysis of the magnetic field of the coil unit.

Based on the geometry of the coil unit, the magnetic field lines around the winding can be determined or predicted. Within the winding, in turn, isolines can be determined on which the magnetic field strength of the magnetic field has the same value. These isolines arrange themselves essentially concentrically to the winding of the coil unit. If further conductive tracks or loop contacts are arranged along the isolines, the induction currents would be optimally formed therein.

In the context of the invention, the geodesics for the coil unit or, in other words, for the magnetic field of the coil unit can now be determined or predicted. The geodesics of the coil unit—in the sense of the present invention—are lines which at any point are perpendicular or orthogonal to the magnetic field isolines (and also perpendicular to the magnetic field lines) of the coil unit, which in turn are oriented concentrically with respect to the winding of the coil unit. The geodesics, in other words, are the lines that extend in a star shape (but not necessarily linearly) from the center of the coil unit winding (similar to a spider web), and that intersect the magnetic field isolines and the coil unit winding at a right angle at each point. Along the geodesics, minimal eddy currents are formed within the conductive paths, since along the geodesics only the cross-section of the conductive paths is available for the formation of the induced eddy currents.

Thus, the idea of the invention is to first determine the isolines of the magnetic field of the coil unit along which the magnetic field strength has the same value for the energized coil unit, then to determine the geodesics of the coil unit based on the isolines along which the induced eddy currents are minimal, and finally to align the at least one (preferably linear) first sensor element of the capacitive sensor unit along one of the geodesics to minimize the eddy currents within the capacitive coil unit. For example, the at least one first sensor element is the feed line for the capacitive sensor unit. Thus, the feed line for the capacitive sensor unit may correspond to or extend along a geodesic. Incidentally, the sensor element may have a ribbed structure made of the second of the sensor elements, which are arranged parallel to each other and are thus easier to manufacture than a curved shape. Alternatively, these further second sensor elements may also run along further geodesics of the coil unit to further reduce the eddy currents within the capacitive coil unit.

In this way, cross influences and/or interferences between the coil unit and the capacitive sensor unit, even on a smallest area (a printed circuit board), can be minimized. Thus, the sensitivity, the resolution and the geometrical design of the sensor device can be improved in an advantageous way. Thus, in turn, the safety and reliability during operation of the sensor device can be significantly increased.

Furthermore, in a sensor device, the invention may provide that the sensor device is arranged on a printed circuit board. Thus, a compact as well as easily mountable sensor device can be provided.

Furthermore, in a sensor device, the invention can provide that the capacitive sensor unit and the coil unit are arranged on one side, preferably on an outer surface, and/or in a conductive layer (also known as layer) of a printed circuit board, which is configured in particular as a multilayer printed circuit board or multilayer printed circuit foil. Thus, the capacitive sensor unit and the coil unit can be arranged in a space-saving manner. In addition, this allows the detection fields of the capacitive sensor unit and the coil unit to be aligned in the same direction with respect to the printed circuit board. Furthermore, the capacitive sensor unit and the coil unit can thus be manufactured at low cost. In this context, it is conceivable that the capacitive sensor unit and the coil unit are printed (in particular, not wound) on the printed circuit board, preferably photolithographically. In this way, the manufacture of the sensor device can be considerably simplified. In the case of photolithographic printing, the sensor elements are produced by applying a thin layer of a photosensitive photoresist to the surface of the board, which is still completely metallized, for example with a Cu layer. After exposure of the photoresist preferably through a mask with a desired layout of the capacitive sensor unit and the coil unit, depending on the photoresist used, either the exposed or the unexposed portions of the resist are soluble in a suitable developer solution and are removed. If the circuit board treated in this way is brought into a suitable (chemical) etching solution, only the exposed part of the metallized surface is attacked, leaving the parts covered by the photoresist intact. This results in the desired conductor paths in a conductor layer of the printed circuit board.

Furthermore, in a sensor device, the invention can provide that the capacitive sensor unit is at least partially, in particular for the most part, preferably completely, enclosed by the coil unit. In this way, not only the space reduction can be achieved, but also the functionality of the coil unit can be extended in that the coil unit, at least in a rest mode, i.e. in a non-energized state, can act as a shield for the capacitive sensor unit.

Furthermore, in a sensor device, the invention may provide that the coil unit, at least in a rest state, i.e., not energized, is at least partially configured to shield and/or shape a capacitive field of the capacitive sensor unit. Thus, a deliberately shaped as well as interference-free detection field can be provided at the capacitive sensor unit.

Furthermore, in a sensor device, the invention may provide that the capacitive sensing unit is off when the coil unit is in sensing operation, and that the coil unit is off when the capacitive sensor unit is in sensing operation. Thus, it can be ensured that the capacitive sensor unit is not active at the same time as the coil unit is in sensing operation. This can enable reliable separation between the data transmissions by the capacitive sensor unit and the coil unit. A virtual and/or physical switch may be provided for switching between the capacitive sensor unit and the coil unit. In this way, the capacitive sensor unit can be used to capacitively detect an approach over a first, e.g. long, range of several meters, and the coil unit can be used to transmit safety-relevant or sensitive data over a second, e.g. much shorter, range of only a few centimeters, millimeters or even micrometers.

Furthermore, in a sensor device, the invention may provide that the coil unit comprises one, in particular only one, winding and/or loop antenna. Thus, the capacitive sensor unit can be surrounded or enclosed by the coil unit in a simple manner. In addition, an inductive and/or electromagnetic coil unit can thus be provided which is simple, inexpensive and safe in operation.

Within the scope of the invention, it is conceivable that the coil unit comprises at least one LDC coil or at least one NFC coil. With the aid of at least one LDC coil, a high-resolution, sensitive inductive sensor unit can be provided that can detect the smallest movements and/or finest pressure exertions of only a few millimeters and/or micrometers. With the aid of at least one NFC coil, a contactless exchange of data by means of electromagnetic induction with another loosely coupled coil can be enabled, in particular over short distances of only a few centimeters. The coil unit can thus be used to communicate with a vehicle-side security system and/or a user-side mobile handheld device, in particular to verify authentication of the user detected by the capacitive sensor unit.

Furthermore, in a sensor device, the invention may provide that the winding is substantially loop-shaped and/or circularly performed. Thus, a simple and inexpensive sensor element can be provided within the coil unit.

Furthermore, in a sensor device, the invention may provide that the winding is aligned along an outer edge of a printed circuit board. Thus, the geometry of the sensor device can be adapted to the geometry of the printed circuit board in an advantageous manner and the area of the printed circuit boards can be optimally utilized.

Furthermore, in a sensor device, the invention can provide that the coil determines a plane in which the capacitive sensor unit is arranged, in particular in a planar manner. Thus, the capacitive sensor unit and the coil unit can be arranged on a printed circuit board in a space-saving manner.

Furthermore, in a sensor device, the invention may provide that the capacitive sensor unit and/or the coil unit comprise line-shaped and/or tape-shaped sensor elements. Such sensor elements require little space and can be manufactured in a cost-effective manner.

It is also conceivable that sensor elements of the capacitive sensor unit and/or the coil unit are produced photolithographically. In this way, a flat and space-optimized sensor device can be produced.

Furthermore, in a sensor device, the invention can provide that the first sensor element is configured as a feed line for the capacitive sensor unit. In this way, the interference caused by magnetically induced eddy currents within the capacitive sensor unit can be avoided for the most part.

Furthermore, in a sensor device, the invention may provide that the capacitive sensor unit comprises at least one second sensor element to sense a capacitive change in the environment and/or that the capacitive sensor unit comprises a plurality of second sensor elements to sense a capacitive change in the environment. In this way, not only can the capacitive field be expanded, but also the resolution of the capacitive sensor unit can be refined as a result. In this way, with the help of the capacitive sensor unit, it even becomes possible to detect certain motion sequences and/or patterns in addition to the simple approximations.

Furthermore, in a sensor device, the invention may provide that the second sensor elements are arranged in a star-shaped, rib-shaped, ridge-shaped and/or comb-shaped manner. In this way, the second sensor elements can be easily and reliably fabricated to extend the capacitive field in an advantageous manner.

Further, in a sensor device, the invention may provide that the at least one second sensor element and/or the second sensor elements are substantially aligned along geodesics of the coil unit. Thus, eddy currents within the capacitive coil unit may be further minimized.

Further, in a sensor device, the invention may provide that the at least one second sensor element and/or the second sensor elements extend from an end or section of the first sensor element, particularly one that is internal within the coil unit. In this way, an entire conductive path structure of the capacitive sensor unit can be realized within the coil unit, which is little to minimally susceptible to the formation of eddy currents.

Furthermore, the object according to the invention is solved by an electronic unit for actuating a movable part, such as, for example, a door, a flap or a lid, of a vehicle, the electronic unit having at least one sensor device which can be configured as described above. With the aid of the electronic unit according to the invention, the same advantages are achieved which were described above in connection with the sensor device according to the invention. Full reference is made to these advantages herein.

In this context, it is conceivable that the capacitive sensor unit is configured for detecting an approach of a user to the sensor device, and that the coil unit is configured for communicating with a vehicle-side security system and/or a user-side mobile handheld device, in particular for verifying an authentication of the detected user. In this way, the electronic unit according to the invention can form part of a keyless entry system (keyless-go or keyless-entry) to a vehicle. Thereby, the electronic unit according to the invention can be used to activate an electric lock of the vehicle. The activation (unlocking and, if necessary, opening) of the lock can be triggered, for example, by an ID transmitter (identification transmitter), which transmits a code to the sensor device by means of the coil unit for authentication. It is also possible that communication with the ID transponder and/or activation of the lock only takes place when or after a user has detected an approach to the sensor device with the aid of the capacitive sensor unit. The electronic unit can be arranged directly behind the movable part, such as a door, a flap or a lid, of the vehicle or in a special handle and/or an actuating element for the movable part.

Furthermore, the object according to the invention is solved by door handle for a vehicle, wherein the door handle has at least one electronic unit, which can be configured as described above, and wherein the electronic unit is arranged in a recess in the door handle. With the aid of the door handle according to the invention, the same advantages are achieved which were described above in connection with the sensor device according to the invention and/or with the electronic unit according to the invention. Full reference is made to these advantages here.

Furthermore, the object according to the invention is solved by a method for manufacturing a sensor device, in particular for a vehicle, comprising: a capacitive sensor unit and a coil unit which at least partially surrounds the capacitive sensor unit. For this purpose, it is provided according to the invention that the capacitive sensor unit is implemented with at least one first sensor element, and that the at least one first sensor element is aligned substantially along a first geodesic of the coil unit. With the aid of the method according to the invention, the same advantages are achieved as described above in connection with the door handle according to the invention, with the sensor device according to the invention and/or with the electronic unit according to the invention. These advantages are fully referred to herein.

In a method in the sense of the invention, it is also conceivable that the capacitive sensor unit and/or the coil unit is/are configured with linear and/or tape-shaped sensor elements, and/or that sensor elements of the capacitive sensor unit and/or the coil unit are produced photolithographically. Here, too, reference is made to the advantages of linear and/or ribbon-shaped sensor elements already described above as well as of photolithographic production of the sensor elements.

Further, in a method of making a sensor device, the invention may provide that the capacitive sensing unit is implemented with at least one second sensor element to sense a capacitive change in the environment and/or that the capacitive sensing unit is implemented with a plurality of second sensor elements to sense a capacitive change in the environment.

It is conceivable that the second sensor elements are aligned in a star-shaped, rib-shaped, burr-shaped and/or comb-shaped manner.

Furthermore, it is conceivable that the at least one second sensor element and/or the second sensor elements is/are substantially aligned along geodesics of the coil unit.

Figure 2:
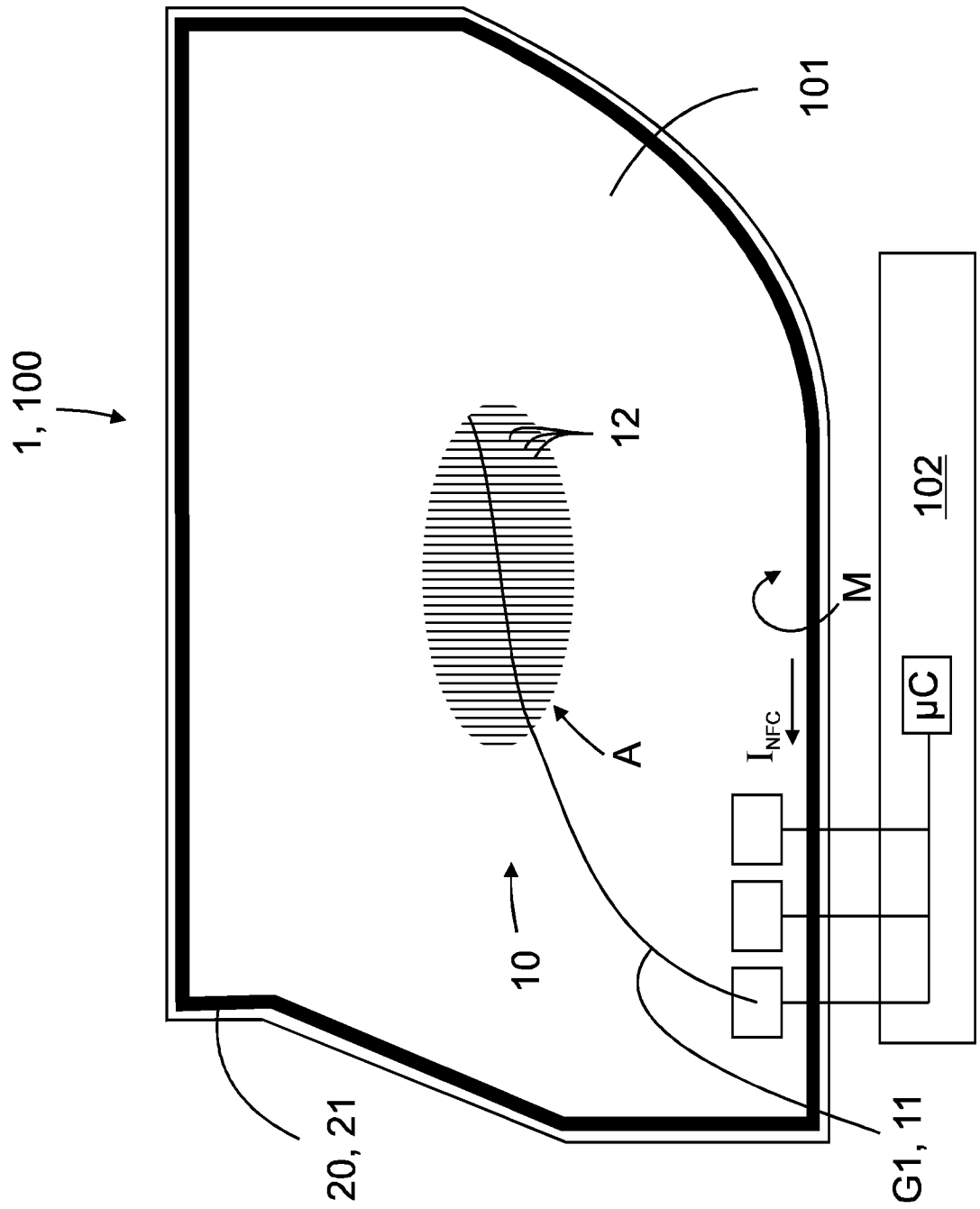
Figure 3:
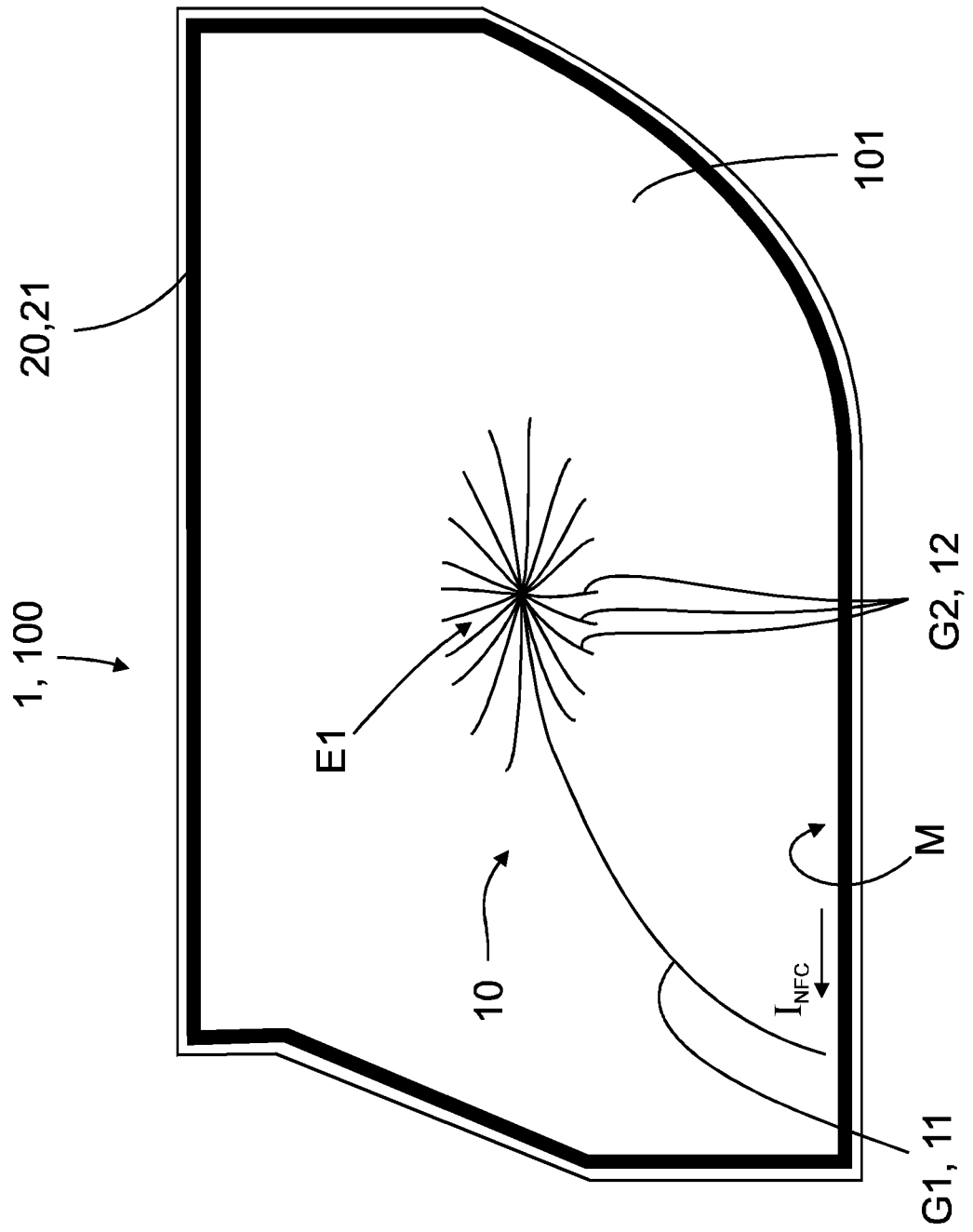
Figure 4:
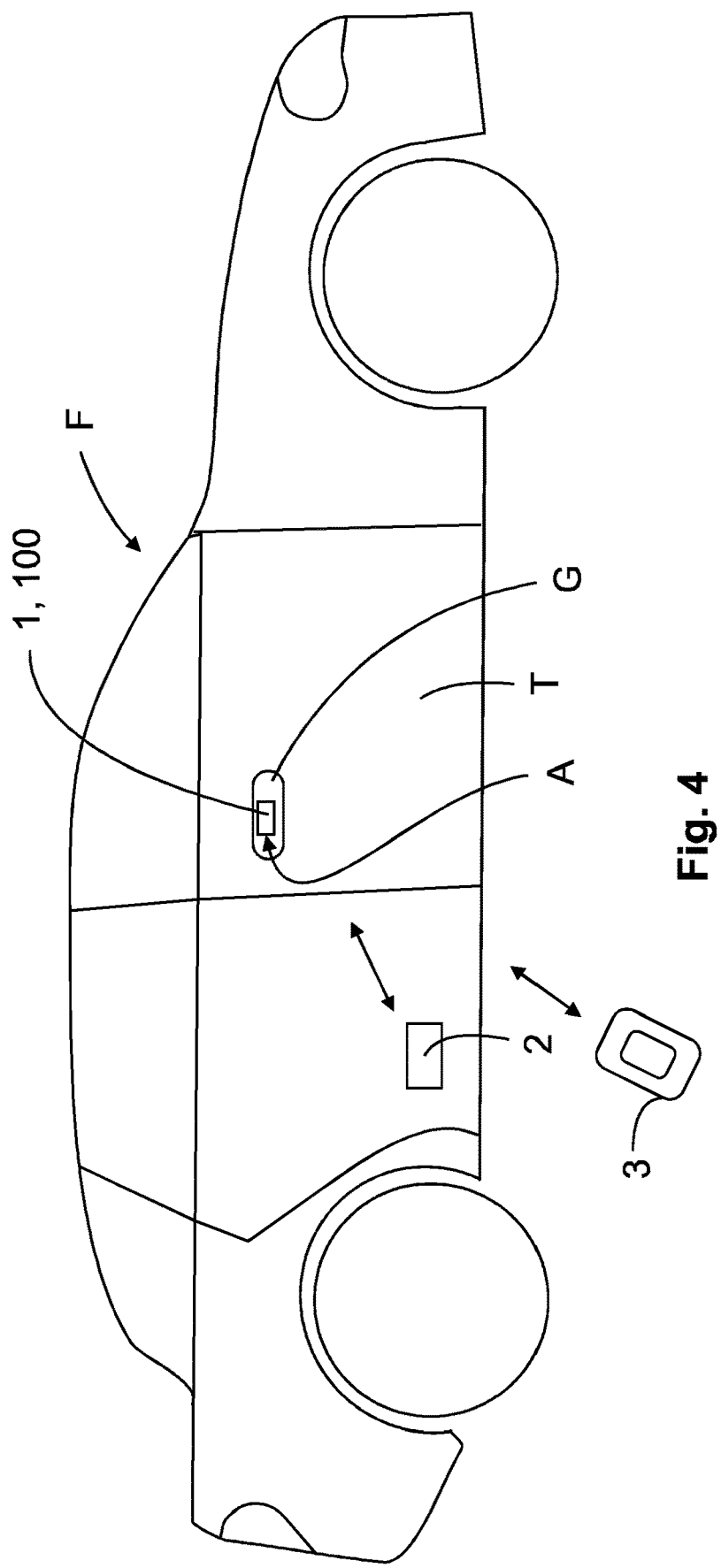

Further advantages, features and details of the invention will be apparent from the following description, in which embodiments of the invention are described in detail with reference to the drawings. In this connection, the features mentioned in the claims and in the description may each be essential to the invention individually or in any combination. Showing:

FIG. 1 a schematic representation of a coil unit according to the invention,

FIG. 2 a schematic representation of a sensor device according to the invention, FIG. 3 a schematic representation of a sensor device according to the invention, and FIG. 4 a schematic representation of a door handle of a vehicle according to the invention.

In the following figures, the identical reference signs are used for the same technical features, even from different embodiments. As a rule, the reference signs of the same embodiments are described only once.

FIG. 1 shows an exemplary sensor device 100 with a coil unit 20 in the sense of the invention. The coil unit 20 can be used for communicating with a safety system 2 of a vehicle F and/or a user-side mobile hand-held device, which are shown schematically below in FIG. 4. Such a sensor device 100 may form part of an electronic unit 1, which is configured, for example, to actuate a movable part T, such as a door, a flap or a lid, of the vehicle. For detecting a presence of a user, such a sensor device 100 is implemented with a capacitive sensor unit 10, exemplarily shown in FIGS. 2 and 3.

The capacitive sensor unit 10 is implemented with sensor elements 11, 12 in the form of line-shaped and/or tape-shaped conductor tracks, which are printed on a printed circuit board 101. To save space, the coil unit 20 is also arranged geometrically around the capacitive sensor unit 10 on the same printed circuit board 101 (cf. FIGS. 2 and 3). Due to the close arrangement of the coil unit 20 next to the capacitive sensor unit 10, eddy currents may occur in the capacitive sensor unit 10.

The invention proposes an improved sensor device 100, in particular for a vehicle F, exemplarily shown in FIGS. 2 and 3, in which the induction of eddy currents, even on a limited area of a printed circuit board 101, is reduced. Furthermore, the invention proposes an improved electronic unit 1 for actuating a movable part T, such as for example a door, a flap or a lid, of a vehicle F, with a corresponding sensor device 100, shown schematically in FIG. 4. Moreover, the invention proposes a door handle G for a vehicle F with a corresponding electronic unit 1, also shown schematically in FIG. 4. Furthermore, the invention proposes a method for manufacturing a corresponding sensor device 100, in particular for a vehicle F, the procedure of which is explained with reference to FIGS. 1 to 3.

In the sensor device 100, the invention provides that the capacitive sensor unit 10 comprises at least one first, in particular linear, sensor element 11, which is substantially aligned along a first geodesic G1 of the coil unit 20, as shown in FIGS. 2 and 3.

The capacitive sensor unit 10 in the context of the invention has at least one first line-shaped sensor element 11 and at least one second line-shaped sensor element 12, but preferably a plurality of second sensor elements 12, which can extend from an end E1 (cf. FIG. 3) or section A1 (cf. FIG. 2) of the first sensor element 11, which end E1 or section A1 is located in particular inside the coil unit 20.

The at least one first linear sensor element 11 and the at least one second linear sensor element 12, but preferably a plurality of second sensor elements 12, form a conductive path structure within the coil unit 20.

The coil unit 20 may be configured as an inductive sensor unit with at least one LDC coil, which can detect a movement of a metallic element of a few millimeters or even micrometers with respect to the at least one LDC coil. Moreover, in the sense of the invention, the coil unit 20 may be implemented as an electromagnetic sensor unit with at least one NFC coil, which may be used for contactless exchange of data by means of electromagnetic induction through loosely coupled coils. In both cases, the coil unit 20 may comprise one, in particular only one, winding 21 and/or loop antenna, as shown in FIGS. 1 to 3.

The coil unit 20 in the form of a winding 21 and/or loop antenna generates a magnetic field when energized, as indicated in FIG. 1. The magnetic field lines M wind around the energized winding 21 or loop antenna of the coil unit 20. These magnetic field lines M can in turn induce eddy currents in internal sensor elements 11, 12 of the sensor unit 10.

Here, the geometry of the sensor elements 11, 12 of the capacitive sensor unit 10 can be adapted on the basis of the magnetic field of the coil unit 20 in such a way that the induction of the eddy currents within the capacitive sensor unit 10 is at least reduced, preferably minimized.

Based on the known geometry of the coil unit 20, the magnetic field lines M around the winding 21 can be determined or predicted. Within the winding 21 again isolines I can be determined, on which the magnetic field strength of the magnetic field of the energized coil unit 20 has the same value. As FIG. 1 further indicates, these isolines I are arranged substantially concentrically to the winding 21 of the coil unit 20. If further conductive tracks or loop contacts are arranged along the isolines 21, the induction currents will be formed therein with a uniform current intensity $I_{Winder}$.

Knowing the isolines I, geodesics G1, G2 are now determined or predicted for the coil unit 20 and the magnetic field of the coil unit 20, respectively. The geodesics G1, G2 of the coil unit 20 are lines shown in FIG. 1 which are perpendicular or orthogonal to the isolines I of the magnetic field of the coil unit 20 at each point. In other words, the geodesics G1, G2 are the lines which depart from the center of the winding 21 of the coil unit 20 in a star shape (similar to a spider web) and which intersect the isolines I and the winding 21 of the coil unit 20 at each point at a right angle. Along the geodesics G1, G2, minimal eddy currents can be induced within the sensor elements 11, 12 of the capacitive sensor unit 10, since along the geodesics G1, G2 only the cross-section of the line-shaped sensor elements 11, 12 is available for the formation of the induced eddy currents.

The at least one first sensor element 11 may be listed, for example, in the form of a lead for the capacitive sensor unit 10, as illustrated by FIGS. 2 and 3. Furthermore, the capacitive sensor unit 10 may comprise a rib structure of the second sensor elements 12, as indicated by FIG. 2. Such parallel conductive paths can be produced particularly easily. Alternatively, the second sensor elements 12 can also run along further geodesics of the coil unit 20, as shown in FIG. 3, in order to further reduce the eddy currents within the capacitive coil unit 10.

Thus, with the help of the invention, cross influences and/or interferences between the coil unit 20 and the capacitive sensor unit 10 can be minimized, even on a smallest area. Thereby, the sensitivity, the resolution and the geometrical design of the sensor device 100 can be improved in an advantageous way and the safety in the operation of the sensor device 100 can be significantly increased.

As further shown in FIGS. 2 and 3, the sensor device 100 may be disposed on a printed circuit board 101 to provide a compact and easy-to-use sensor device 100.

Furthermore, FIGS. 2 and 3 show that the capacitive sensor unit 10 and the coil unit 20 can be arranged on one side, preferably on an outer surface and/or in a conductive layer of the printed circuit board 101. In this way, the detection fields of the capacitive sensor unit 10 and the coil unit 20 can be aligned in the same direction with respect to the printed circuit board, for example away from the vehicle F.

In the context of the invention, the capacitive sensor unit 10 and the coil unit 20 may be photolithographically printed on the printed circuit board 101. In a photolithographic printing process, a thin layer of a photosensitive photoresist is applied to the surface of a printed circuit board 101 that is fully metallized, for example, with a Cu layer. After exposing the photoresist through a mask having a desired layout of the capacitive sensor unit 10 and the coil unit 20, either the exposed or unexposed portions of the resist are dissolved in a suitable developer solution, depending on the photoresist used, and thus removed. The thus treated circuit board 101 is then immersed in a suitable etching solution in which only the exposed portion of the metallized surface is attacked, leaving the portions of the circuit board 101 covered by the photoresist intact.

As shown in FIG. 2, the capacitive sensor unit 10 is largely, preferably completely, enclosed by the coil unit 20. From the supply line of the capacitive sensor unit 10, only one line leads to a schematically shown control unit 102, which takes over the evaluation of the detection by the sensor device 100.

In this regard, the control unit 102 may be implemented as a dedicated control unit 102 for the sensor device 100 or as part of a central control unit 102 in a vehicle F.

Another advantage of arranging the coil unit 20 around the capacitive sensor unit 10 may be that the coil unit 20, at least in a non-energized rest mode, may serve to shield and/or shape a capacitive field of the capacitive sensor unit 10.

Advantageously, it is further conceivable that the capacitive sensor unit 10 is turned off when the coil unit 20 is in sensing operation, and that the coil unit 20 is turned off when the capacitive sensor unit 10 is in sensing operation. Thus, it can be ensured that the capacitive sensor unit 10 is not active20 at the same time as the coil unit to strictly separate data transmissions by the capacitive sensor unit 10 and the coil unit 20. A virtual and/or physical switch, for example on the control unit 102, can be provided for switching between data transmission using the capacitive sensor unit 10 and data transmission using the coil unit 20.

As further shown in FIGS. 1 to 3, the winding 21 of the coil unit 20 may be substantially looped and/or circular in shape and preferably extend along an outer edge of the printed circuit board 101.

As shown in FIGS. 2 and 3, the winding 21 of the coil unit 20 lies in the plane of the printed circuit board 101 and in the plane in which the capacitive sensor unit is arranged, in particular in a planar manner.

The foregoing explanation of the embodiments describes the present invention exclusively in the context of examples. Of course, individual features of the embodiments can be freely combined with each other, provided that this is technically reasonable, without leaving the scope of the present invention.

LIST OF REFERENCE SIGNS

100 Sensor device
101 Printed circuit board
102 Control unit
10 Sensor unit
11 First sensor element
12 Second sensor element
20 Coil unit
21 Winding
1 Electronic unit
2 Safety system
3 Mobile handheld device
G1 $1^{st}$ geodesic
G2 $2^{nd}$ geodesic
I Isolines
I Current$_{Winder}$
M Magnetic field line
A1 Section
E1 End
F Vehicle
T Movable part
G Door handle
A Recess

The invention claimed is:

1. A sensor device, comprising:
a capacitive sensor unit,
a coil unit which at least partially, surrounds the capacitive sensor unit,
a control unit, and
a physical switch controllable by the control unit to selectively turn on or turn off a sensing operation of each of the capacitive sensor unit and the coil unit,
wherein
the capacitive sensor unit has at least one first sensor element which is aligned essentially along a first geodesic of the coil unit,
wherein
the capacitive sensor unit comprises a plurality of second sensor elements for sensing a capacitive change in the environment,
wherein
the second sensor elements are arranged in a star-shaped manner,
wherein
the physical switch is controllable to turn off the sensing operation of the capacitive sensor unit when the sensing operation of the coil unit is turned on, and
the physical switch is controllable to turn off the sensing operation of the coil unit when the sensing operation of the capacitive sensor is turned on.

2. The sensor device according to claim 1,
wherein
at least the sensor device further comprises a printed circuit board,
or the capacitive sensor unit and the coil unit are arranged at least on a side or in a conductive layer of a printed circuit board.

3. The sensor device according to claim 1,
wherein the coil unit is configured at least in part at least to shield or to shape a capacitive field of the capacitive sensor unit.

4. The sensor device according to claim 1,
wherein
the coil unit has at least one, winding or loop antenna.

5. The sensor device according to claim 4,
wherein
at least the winding is essentially at least loop-shaped or circular,
or the winding is aligned along an outer edge of a printed circuit board,
or the winding determines a plane in which the capacitive sensor unit is arranged.

6. The sensor device according to claim 1,
wherein
at least the capacitive sensor unit or the coil unit have at least line-shaped or band-shaped sensor elements,
or sensor elements at least of the capacitive sensor unit or the coil unit are produced photolithographically.

7. The sensor device according to claim 1,
wherein
the first sensor element is configured as a feed line for the capacitive sensor unit.

8. The sensor device according to claim 1,
wherein
at least the second sensor elements are substantially aligned along geodesics of the coil unit.

9. The sensor device according to claim 1,
wherein
at least the second sensor elements extend from an end or section of the first sensor element.

10. An electronic unit for actuating a movable part of a vehicle,
wherein
the electronic unit comprises at least one sensor device according to claim 1.

11. The electronic unit according to claim 10,
wherein
the capacitive sensor unit is configured for detecting an approach of a user to the sensor device,
and the coil unit is configured for at least communicating with a vehicle-side security system or a user-side mobile handheld device.

12. The electronic unit according to claim 10, wherein the movable part is a door, a flap or a cover of the vehicle.

13. A door handle for a vehicle,
wherein the door handle comprises at least one electronic unit according to claim 10,
and wherein the electronic unit is arranged in a recess in the door handle.

14. A method for manufacturing a sensor device, comprising:
implementing a capacitive sensor unit,
arranging a coil unit at least partially surrounding the capacitive sensor unit,
providing a control unit, and
providing a physical switch controllable by the control unit to selectively turn on or turn off a sensing operation of each of the capacitive sensor unit and the coil unit,
wherein
the capacitive sensor unit is implemented with at least one first sensor element,
and that the at least one first sensor element is substantially aligned along a first geodesic of the coil unit,
wherein
the capacitive sensor unit comprises a plurality of second sensor elements for sensing a capacitive change in the environment,
wherein
the second sensor elements are arranged in a star-shaped manner, and
wherein
the physical switch is controllable to turn off the sensing operation of the capacitive sensor unit when the sensing operation of the coil unit is turned on, and
the physical switch is controllable to turn off the sensing operation of the coil unit when the sensing operation of the capacitive sensor is turned on.

15. The method according to claim 14,
wherein
at least the capacitive sensor unit or the coil unit are/is configured at least with linear or band-shaped sensor elements,
or the sensor elements at least of the capacitive sensor unit or the coil unit are produced photolithographically.

16. The method according to claim 14,
wherein
at least the at least one second sensor element or the second sensor elements is/are aligned substantially along geodesics of the coil unit.

* * * * *